(12) United States Patent
Nishizaka et al.

(10) Patent No.: US 11,604,383 B2
(45) Date of Patent: Mar. 14, 2023

(54) DISPLAY DEVICE

(71) Applicant: SHARP KABUSHIKI KAISHA, Sakai (JP)

(72) Inventors: Masaki Nishizaka, Sakai (JP);
Katsuaki Yamada, Sakai (JP);
Tomohiko Okada, Sakai (JP);
Wooseong Jeong, Sakai (JP);
Toshiyuki Gotoh, Sakai (JP); Hidenori Ishii, Sakai (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 0 days.

(21) Appl. No.: 17/725,333

(22) Filed: Apr. 20, 2022

(65) Prior Publication Data
US 2022/0342261 A1 Oct. 27, 2022

(30) Foreign Application Priority Data
Apr. 23, 2021 (JP) .............................. JP2021-073539

(51) Int. Cl.
*G02F 1/1335* (2006.01)
*G02F 1/1333* (2006.01)
*H05K 7/20* (2006.01)
*G02F 1/13357* (2006.01)

(52) U.S. Cl.
CPC .... *G02F 1/133612* (2021.01); *G02F 1/13332* (2021.01); *G02F 1/133314* (2021.01); *G02F 1/133603* (2013.01); *G02F 1/133628* (2021.01); *H05K 7/20209* (2013.01)

(58) Field of Classification Search
None
See application file for complete search history.

(56) References Cited

U.S. PATENT DOCUMENTS

| 10,973,100 | B1 | 4/2021 | Kanayama et al. |
| 2021/0092815 | A1 | 3/2021 | Kanayama et al. |
| 2021/0364861 | A1* | 11/2021 | Lum ................ G02F 1/133603 |

FOREIGN PATENT DOCUMENTS

JP 2019-121684 A 7/2019

* cited by examiner

*Primary Examiner* — Richard H Kim
(74) *Attorney, Agent, or Firm* — ScienBiziP, P.C.

(57) ABSTRACT

A display device includes a housing, a display panel, a light source, a first acquirer, a second acquirer, and a stabilizer. The display panel is provided in the housing. The light source is provided in the housing, and includes an LED that irradiates the display panel with light. The first acquirer acquires a first temperature in a first region including a region where the light source is disposed in the housing. The second acquirer acquires a second temperature in a second region different from the first region. The stabilizer has a first adjustment mode for lighting the LED with maximum luminance as an adjustment mode for stabilizing luminance of the LED. The stabilizer operates the LED in the first adjustment mode in a case where a temperature difference between the first temperature and the second temperature is a first threshold value or more.

7 Claims, 10 Drawing Sheets

DISPLAY DEVICE

INCORPORATION BY REFERENCE

This application claims the priority based on Japanese Patent Application No. 2021-073539 filed on Apr. 23, 2021 under 35 U.S.C. 119, the contents of which are hereby incorporated herein.

BACKGROUND

The present disclosure relates to a display device.

A light emitting diode (LED: Light Emitting Diode) is used for a backlight of the display device. The luminance of the LED depends on a temperature. The screen luminance of the display device varies with the luminance of the backlight, and therefore it is necessary to wait until a stabilization process of stabilizing the luminance of the backlight is completed. A document (Japanese Unexamined Patent Application Publication No. 2019-121684) discloses an LED luminance control circuit that stabilizes the luminance of an LED quickly. This LED luminance control circuit stabilizes the luminance of the LED by gradually increasing a current value of the LED on the basis of a cathode potential of the LED and bringing the current value closer to a target current value.

SUMMARY

A display device according to the present disclosure includes a housing, a display panel, a light source, a first acquirer, a second acquirer, and a stabilizer. The display panel is provided in the housing. The light source is provided in the housing, and includes an LED that irradiates the display panel with light. The first acquirer measures a first temperature in a first region including a region where the light source is disposed in the housing. The second acquirer acquires a second temperature in a second region different from the first region. The stabilizer has a first adjustment mode as an adjustment mode for stabilizing luminance of the LED, and operates the LED in the first adjustment mode. The first adjustment mode is a mode for adjusting the luminance of the LED to maximum luminance in a case where a temperature difference between the first temperature and the second temperature is a first threshold value or more.

DETAILED DESCRIPTION

Hereinafter, a display device according to an embodiment will be described with reference to the drawings. In the drawings, identical or equivalent parts are denoted by the same reference numerals, and description is not repeated.

Figure 1:
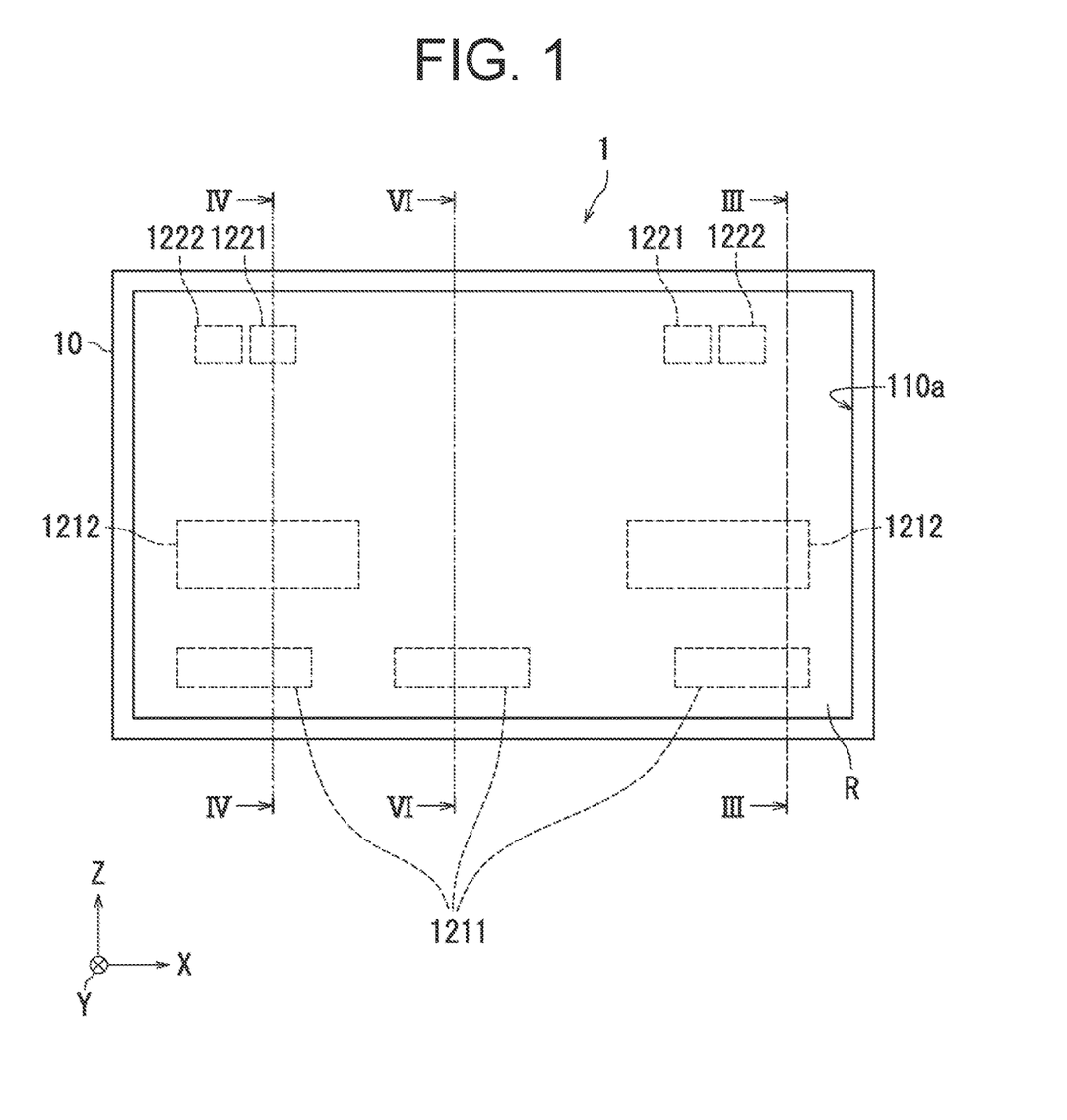
FIG. 1 is a schematic diagram illustrating appearance of a display device according to an embodiment.

FIG. 1 is a schematic diagram illustrating appearance of a display device 1 according to an embodiment. The display device 1 is a high-resolution display, for example, 8K. As illustrated in FIG. 1, the display device 1 includes a housing 10. A front surface (Y-axis negative direction side) of the housing 10 has an opening part 110a that exposes a display region R for displaying an image. A back surface (Y-axis positive direction side) of the housing 10 has intake ports 1211 and 1212, and exhaust ports 1221 and 1222.

Figure 2:
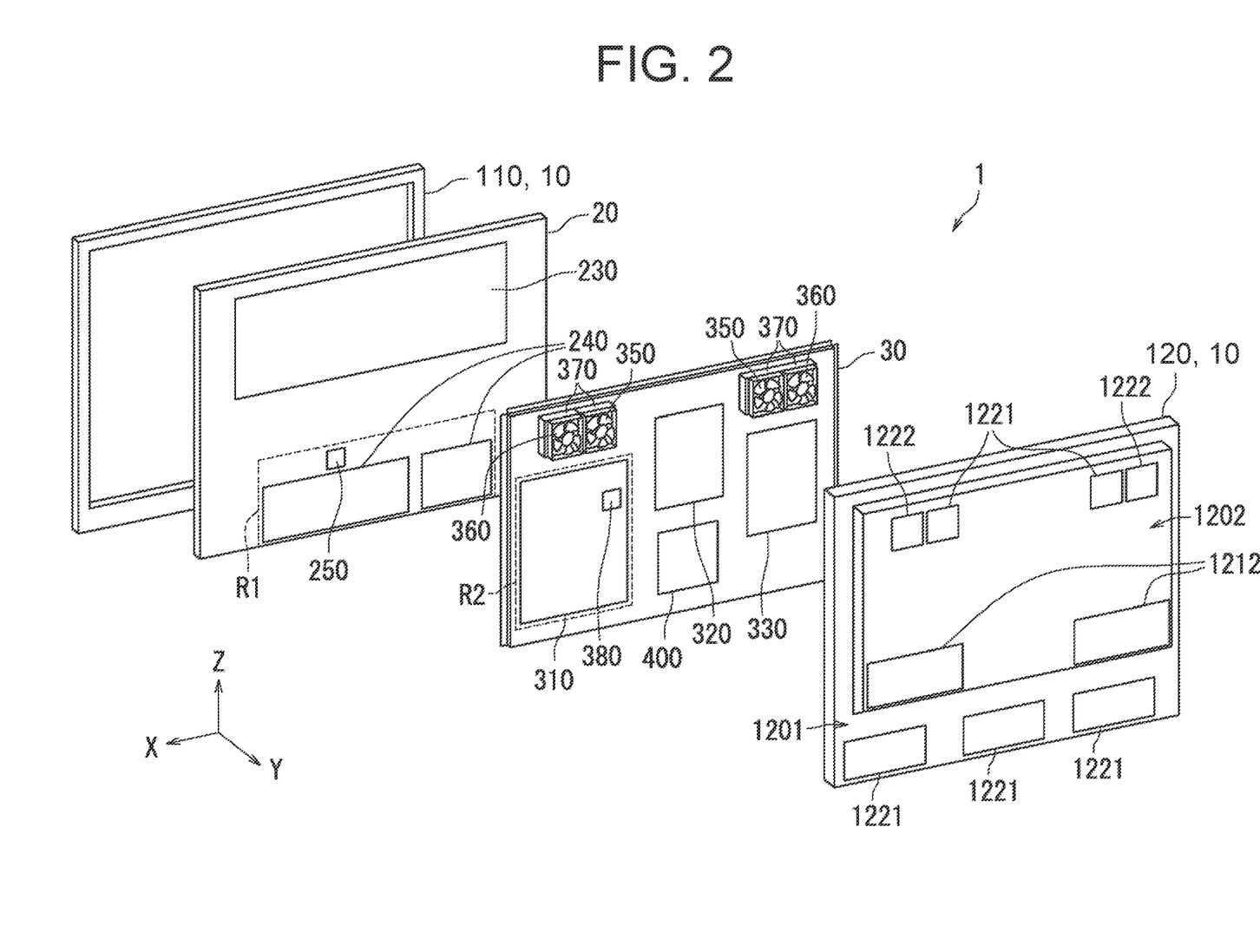
FIG. 2 is an exploded view of a schematic configuration of the display device illustrated in FIG. 1.
Figure 3:
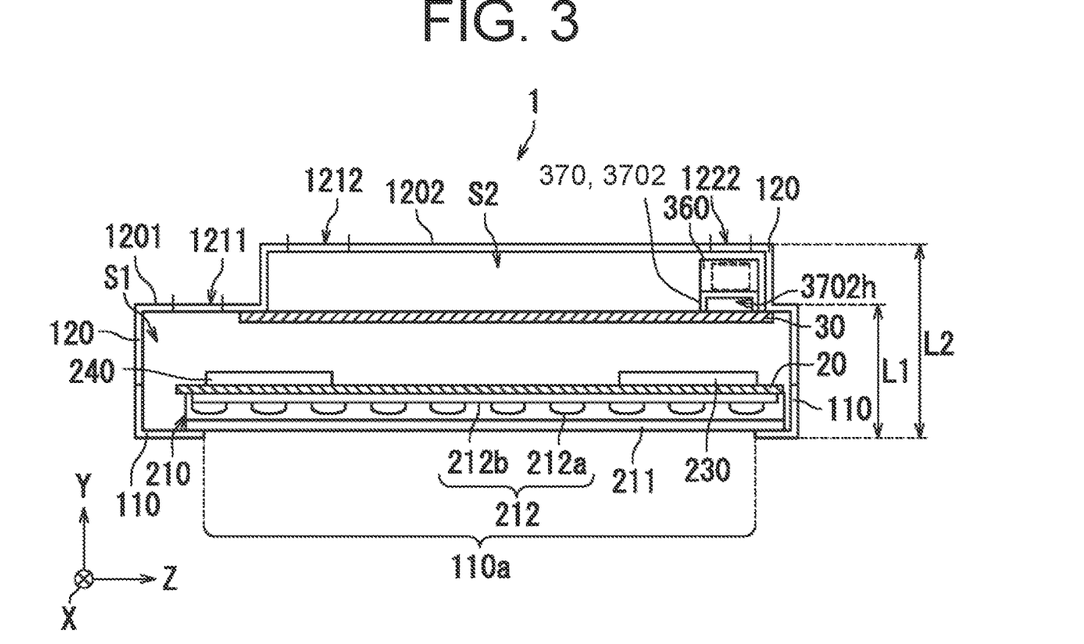
FIG. 3 is a sectional view illustrating a schematic cross section taken along the III-III line in FIG. 1.
Figure 4:
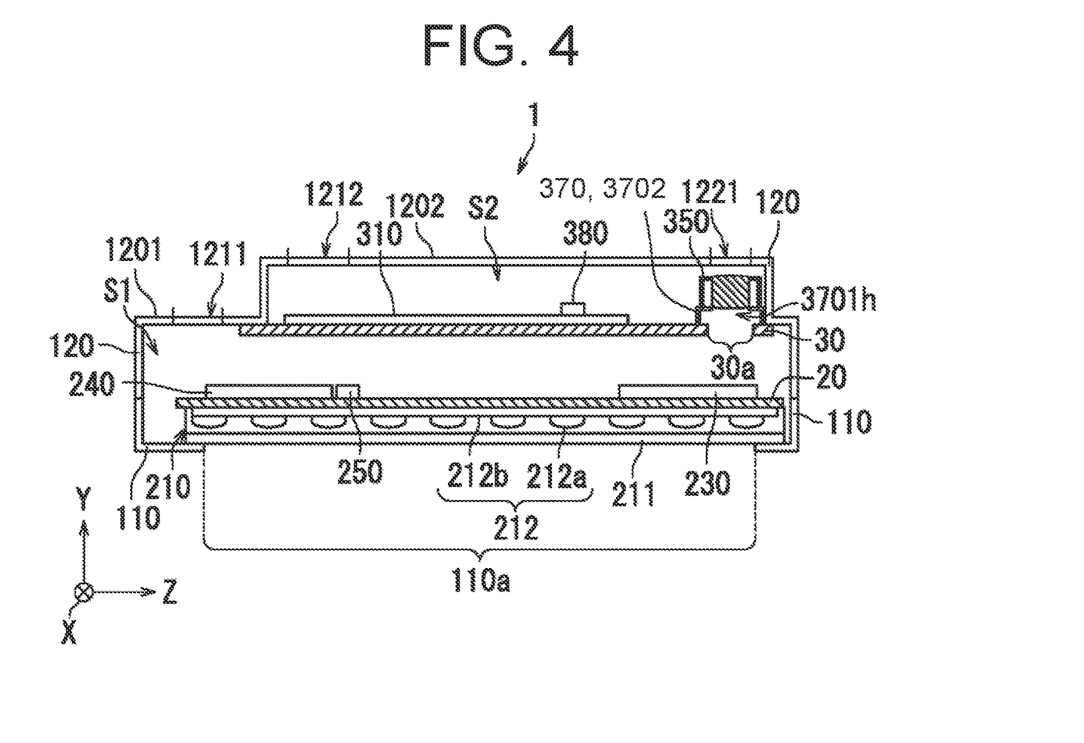
FIG. 4 is a sectional view illustrating a schematic cross section taken along the IV-IV line in FIG. 1.

FIG. 2 is an exploded view illustrating a schematic configuration of the display device 1 illustrated in FIG. 1. FIG. 3 is a sectional view illustrating a schematic cross section taken along the III-III line in FIG. 1. FIG. 4 is a sectional view illustrating a schematic cross section taken along the IV-IV line in FIG. 1. Hereinafter, an internal structure of the display device 1 will be specifically described with reference to FIG. 2 to FIG. 4.

As illustrated in FIG. 2 to FIG. 4, the display device 1 includes a front housing 110 and a back housing 120 as a housing 10, and a first chassis 20, and a second chassis 30. The first chassis 20 and the second chassis 30 are disposed between the front housing 110 and the back housing 120. Specifically, the first chassis 20 is provided on the front housing 110 side with respect to the second chassis 30, and the second chassis 30 is provided between the first chassis 20 and the back housing 120.

The projected area of the second chassis 30 is smaller than the projected area of the first chassis 20. The back housing 120 has a first back surface 1201 that covers the first chassis 20, and a second back surface 1202 that covers the second chassis 30. A step is formed between the first back surface 1201 and the second back surface 1202. As illustrated in FIG. 3, due to this step, the thickness L2 from the front surface (Y-axis negative direction side) of the front housing 110 to the second back surface 1202 is thicker than the thickness L1 from the front surface (Y-axis negative direction side) of the front housing 110 to the first back surface 1201. At a position of the step in the back housing 120, a surface on the back housing 120 side in the second chassis 30 is in contact with an inner surface of the back housing 120.

The display device 1 has a first internal space S1 (an example of a first internal space layer) and a second internal space S2 (an example of a second internal space layer) in the housing 10, and the second chassis 30 is disposed between the first internal space S1 and the second internal space S2. The first internal space S1 is an internal space on the first chassis 20 side, and the second internal space S2 is an internal space on the back housing 120 side.

Furthermore, the display device 1 includes a display module 210, a display control circuit board 230, an LED driving circuit board 240, a first temperature detection circuit 250 (an example of a first acquirer), a main board 310, an image processing circuit board 320, a power supply unit 330, a plurality of fan installation members 370, a plurality of first fans 350 and a plurality of second fans 360, and a second temperature detection circuit 380 (an example of a second acquirer), in the housing 10.

The display module 210, the display control circuit board 230, the LED driving circuit board 240, the first temperature detection circuit 250, the image processing circuit board 320, the power supply unit 330, the plurality of first fans 350, the plurality of second fans 360, and the second temperature detection circuit 380 are electrically connected to the main board 310.

As illustrated in FIG. 2, the first chassis 20 supports the display module 210, the display control circuit board 230, and the LED driving circuit board 240. As illustrated in FIG. 3 and FIG. 4, the display module 210 is disposed on the front housing 110 side in the first chassis 20, and the display control circuit board 230 and the LED driving circuit board 240 are disposed on the back housing 120 side. The display module 210 is disposed in contact with the front housing 110 such that the display region R of the display module 210 is exposed from the opening part 110a of the front housing 110.

As illustrated in FIG. 3 and FIG. 4, the display module 210 includes a display panel 211 and a backlight 212. In this embodiment, the display panel 211 is a liquid crystal display panel. The display panel 211 is electrically connected to the display control circuit board 230. The display control circuit board 230 includes a display panel drive circuit for driving the display panel 211.

The backlight 212 is a directly under type backlight that irradiates an entire back surface of the display panel 211 with light. The backlight 212 includes a plurality of LEDs 212a, and an LED substrate 212b that supports the plurality of LEDs 212a The backlight 212 includes an optical member (not illustrated) such as a reflective sheet for allowing light to enter the display panel 211. The backlight 212 is electrically connected to the LED driving circuit board 240. The LED driving circuit board 240 is electrically connected to the display control circuit board 230. The LED driving circuit board 240 includes an LED drive circuit that turns on or off the plurality of LEDs 212a.

The first temperature detection circuit 250 illustrated in FIG. 2 includes a temperature sensor (not illustrated). The temperature sensor of the first temperature detection circuit 250 is provided in a first region R1 including the LED driving circuit board 240. In this embodiment, the first region R1 is in the vicinity of the LED driving circuit board 240. However, the first region R1 may be a range in which a temperature closer to the temperature of the LEDs 212a can be measured. The first temperature detection circuit 250 detects the temperature of the vicinity of the LED driving circuit board 240 at regular intervals, and outputs information indicating the detected temperature to the main board 310.

As illustrated in FIG. 2, the second chassis 30 supports the main board 310, the image processing circuit board 320, and the power supply unit 330 on the back housing 120 side. As illustrated in FIG. 2, the second chassis 30 supports two sets of the fan installation members 370 disposed apart from each other on the back housing 120 side. A bottom of each fan installation member 370 is connected to the second chassis 30, a pair of a first fan 350 and a second fans 360 are installed in an upper part of each fan installation member 370.

The main board 310 includes a control circuit including a CPU (Central Processing Unit), a memory (ROM (Read Only Memory) and a RAM (Random Access Memory)), a communication interface circuit for communicating with an external device, and the like (all not illustrated). The image processing circuit board 320 electrically connected to the main board 310. The image processing circuit board 320 includes an image processing circuit that adjusts the color, the brightness, and the like of a display image. The power supply unit 330 is electrically connected to each part of the display device 1 and supplies power to each connected part. In two pairs of the first fan 350 and the second fan 360, the rotation operation of the fans is controlled by the main board 310. The first fans 350 are used to exhaust air in the first internal space S1 (FIG. 3 and FIG. 4), and the second fans 360 are used to exhaust air in the second internal space S2 (FIG. 3 and FIG. 4). Hereafter, the respective fan installation members disposed on the X-axis positive direction side and the X-axis negative direction side in the second chassis 30 are sometimes referred to as the fan installation members 370R and 370L.

Figures 5A, 5B:
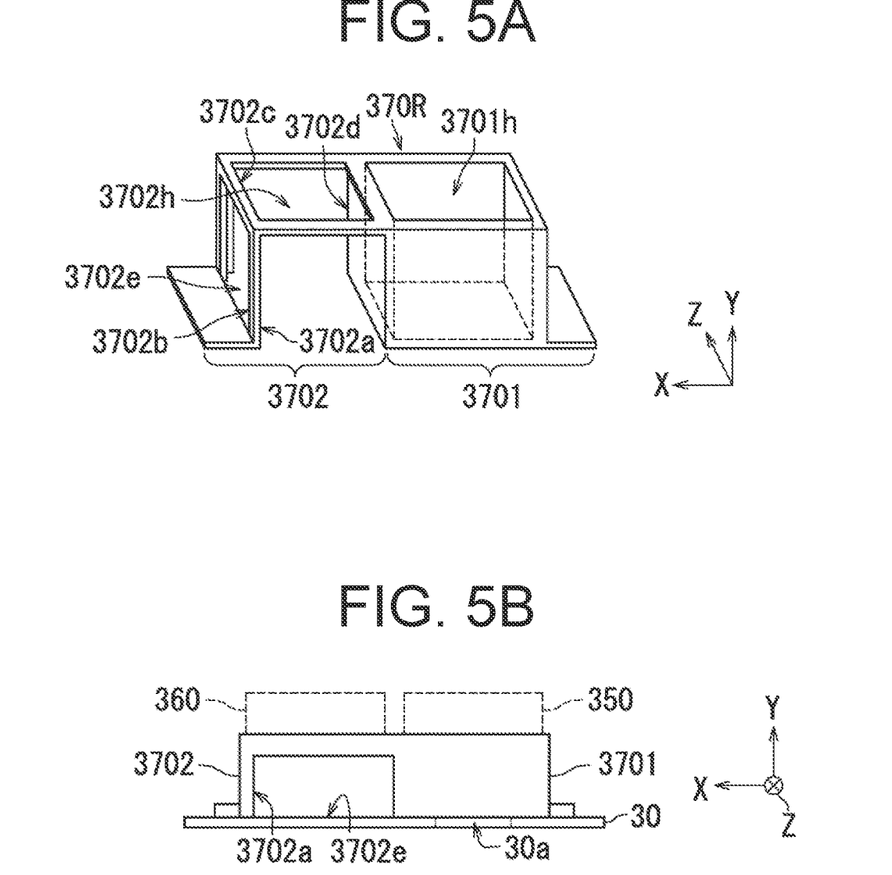
FIG. 5A is a schematic diagram illustrating a fan installation member in the embodiment.
FIG. 5B is a schematic diagram of the fan installation member illustrated in FIG. 5A, viewed from the Z-axis negative direction side.
Figure 5C:
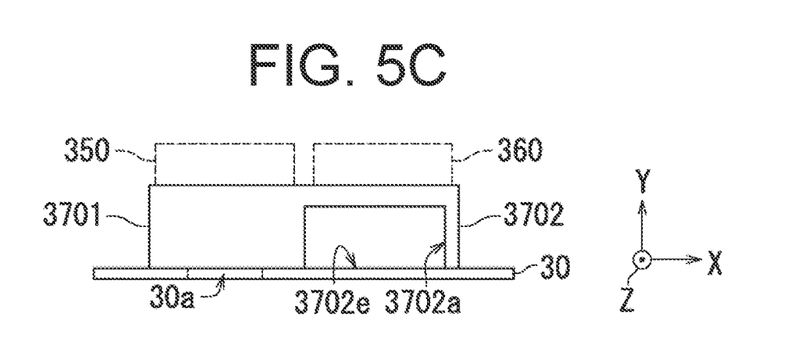
FIG. 5C is a schematic diagram of the fan installation member illustrated in FIG. 5A, viewed from the Z-axis positive direction side.
Figure 5D:
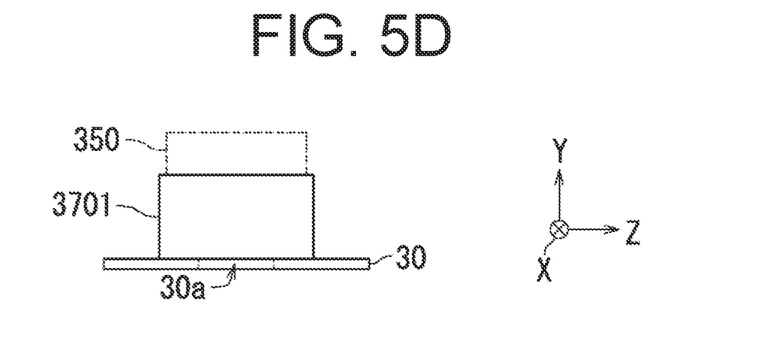
FIG. 5D is a schematic diagram of the fan installation member illustrated in FIG. 5A, viewed from the X-axis negative direction side.
Figure 5E:
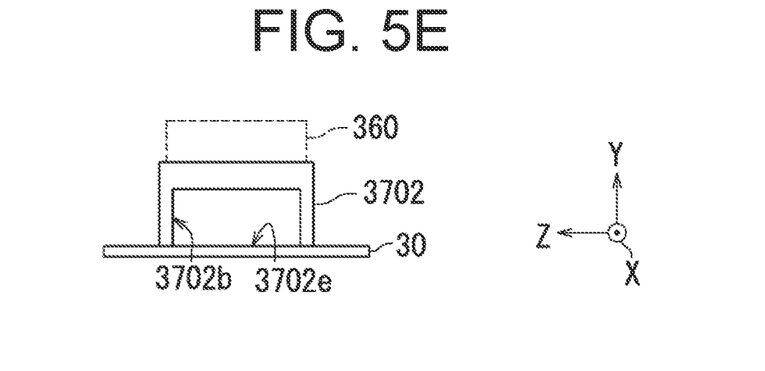
FIG. 5E is a schematic diagram of the fan installation member illustrated in FIG. 5A, viewed from the X-axis positive direction side.

FIG. 5A to FIG. 5E are schematic diagrams each illustrating a structure of the fan installation member 370R. FIG. 5A is a schematic diagram illustrating the fan installation member 370R. FIG. 5B is a schematic diagram of the fan installation member 370R illustrated in FIG. 5A, viewed from the Z-axis negative direction side. FIG. 5C is a schematic diagram of the fan installation member 370R illustrated in FIG. 5A, viewed from the Z-axis positive direction side. FIG. 5D is a schematic diagram of the fan installation member 370R illustrated in FIG. 5A, viewed from the X-axis negative direction side. FIG. 5E is a schematic diagram of the fan installation member 370R illustrated in FIG. 5A, viewed from the X-axis positive direction side.

As illustrated in FIG. 5A to FIG. 5E, the fan installation member 370R has a first installation part 3701 and a second installation part 3702. The first installation part 3701 has a hollow substantially quadrangular prism shape and has a hollow region 3701h that penetrates in the Y-axis direction. As illustrated in FIG. 5B to FIG. 5D, the second chassis 30 has an opening 30a that penetrates the second chassis 30 at a position facing the first installation part 3701. The hollow region 3701h of the first installation part 3701 communicates with the first internal space S1 via the opening 30a. The first fan 350 is disposed on an upper surface of the first installation part 3701 (on the Y-axis positive direction side). A region between the opening 30a and the first fan 350 is shielded from the second internal space S2 by the first installation part 3701. Therefore, an airflow is formed from the first internal space S1 toward a bottom of the first fan 350 through the opening 30a and the hollow region 3701h of the first installation part 3701 by driving of the first fan 350. That is, the first installation part 3701 and the opening 30a of the second chassis 30 is an example of an exhaust duct that guides the air of the first internal space S1 to the first fan 350. The air in the first internal space S1 does not mix with the air in the second internal space S2 by the first installation part 3701 and the opening 30a.

As illustrated in FIG. 5A to FIG. 5E, the second installation part 3702 has a substantially quadrangular prism shape and, and has opening parts 3702a to 3702e in all surfaces except a surface serving as a boundary between the first installation part 3701 and the second installation part 3702. As illustrated in FIGS. 5B, 5C, and 5E, the opening part 3702e in a bottom of the second installation part 3702 is blocked by the second chassis 30. That is, the insides 3702h of the second installation part 3702 communicates with the second internal space S2, but does not communicate with the first internal space S1. The second fan 360 is disposed on an upper surface of the second installation part 3702. Therefore, an airflow is formed from the second internal space S2 toward a bottom of the second fan 360 through the opening parts 3702a to 3702d of the second installation part 3702 by driving of the second fan 360.

Although not illustrated in the drawings, the fan installation member 370L has a structure in which the positions of the first installation part 3701 and the second installation part 3702 of the fan installation member 370R are reversed.

Returning to FIG. 2 to FIG. 4, the second temperature detection circuit 380 includes a temperature sensor (not illustrated). The temperature sensor of the second temperature detection circuit 380 is disposed in a second region R2 including the main board 310. In this embodiment, the second region R2 is on the main board 310. However, the second region R2 may be a region different from the first region R1. The second temperature detection circuit 380 detects the temperature of the main board 310 at regular intervals, and outputs information indicating the detected temperature to the main board 310.

Figure 6:
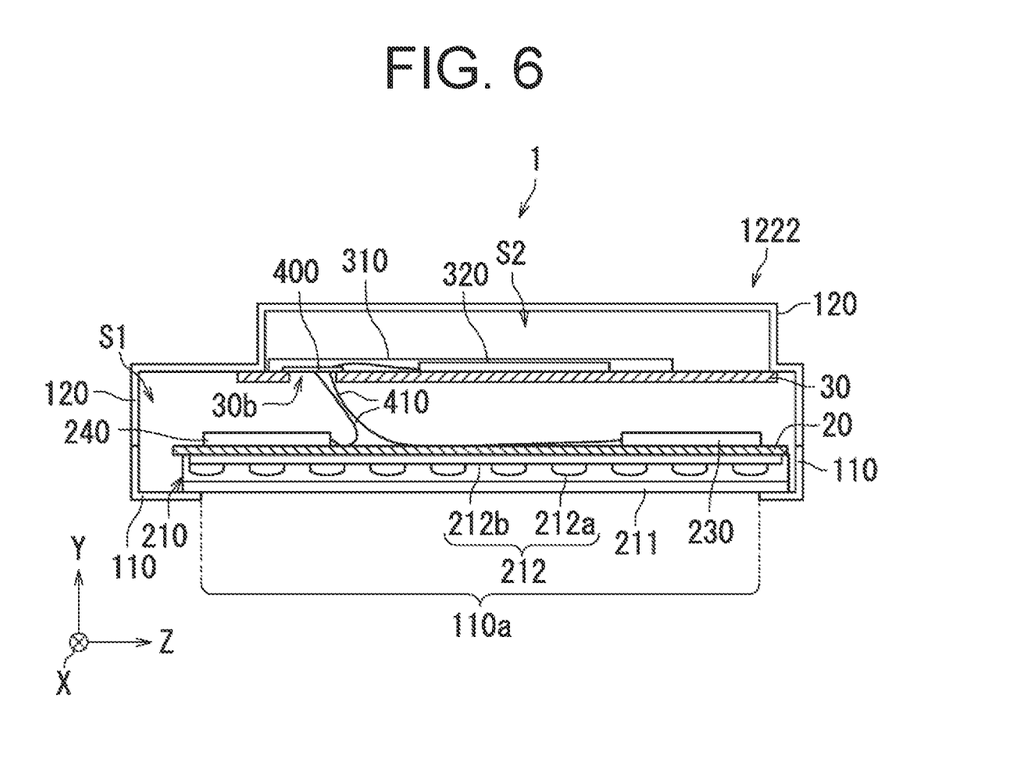
FIG. 6 is a schematic sectional view taken along the VI-VI line illustrated in FIG. 1.

FIG. 6 is a schematic sectional view taken along the VI-VI line illustrated in FIG. 1. As illustrated in FIG. 2 and FIG. 6, the display device 1 further includes a blocking member 400 and a plurality of wires 410 in the housing 10. The blocking member 400 is provided on a surface on the back housing 120 side of the second chassis 30. The blocking member 400 is composed of an insulating material. As illustrated in FIG. 6, the second chassis 30 has an opening part 30b for wiring in a region where the blocking member 400 is provided. In the opening part 30b for wiring, the image processing circuit board 320 disposed on the second chassis 30 and the display control circuit board 230 disposed on the first chassis 20 are connected by the wire 410. In addition, the main board 310 and the power supply unit 330 disposed on the second chassis 30, and the display control circuit board 230 and the LED driving circuit board 240 disposed on the first chassis 20 are connected by the wires 410. The blocking member 400 covers the opening part 30b for wiring through which the wires 410 pass. Thus, in this embodiment, the wires 410 connecting the circuit members disposed on the first chassis 20, and the circuit members disposed on the second chassis 30 are consolidated in one place.

Returning to FIG. 2 to FIG. 4, the intake ports 1211 and 1212 and the exhaust ports 1221 and 1222 are provided in the back housing 120. Specifically, intake ports 1211 (an example of a first intake port and a first intake part) are disposed in the first back surface 1201 of the back housing 120, and the intake ports 1212 (an example of a second intake port and a second intake part) and the exhaust ports 1221 and 1222 are disposed in the second back surface 1202. The first internal space S1 and the outside communicate with each other by the intake ports 1211, and external air is taken into the first internal space S1. The second internal space S2 and the outside communicate with each other by the intake ports 1212, and external air is taken into the second internal space S2.

As illustrated in FIG. 4, the exhaust ports 1221 (an example of the first exhaust port) are provided so as to face the first fans 350, and air sent out from the first fans 350 is exhausted from the exhaust ports 1221. Specifically, as illustrated in FIG. 4, air in the first internal space S1, which flows into the first fans 350 through the openings 30a and the hollow regions 3701h of the first installation parts 3701, is exhausted from the exhaust ports 1221 by driving of the first fans 350. That is, the openings 30a, the first installation part 3701, the first fans 350, and the exhaust ports 1221 are an example of a first exhauster in this embodiment.

In addition, as illustrated in FIG. 3, the exhaust ports 1222 (an example of a second exhauster) are provided so as to face the second fan 360, and air sent out from the second fans 360 is exhausted through the exhaust ports 1222. Specifically, as illustrated in FIG. 3, air in the second internal space S2, which flows into the second fans 360 through the insides 3702h of the second installation parts 3702, is exhausted from the exhaust ports 1222 by driving of the second fans 360. That is, the second installation part 3702, the second fans 360 and the exhaust ports 1222 are an example of a second exhauster in this embodiment.

In this embodiment, the inside of the housing 10 of the display device 1 is separated by the first chassis 20 and the second chassis 30, and the first internal space S1 and the second internal space S2 are formed on the front surface side and the back surface side of the housing 10, respectively. In the second internal space S2, the fans for exhausting the air in the first internal space S1 (first fans 350), and the fans for exhausting the air in the second internal space S2 (second fans 360) are provided. However, the airflow formed by each fan pass through a different internal space.

Figure 7A:
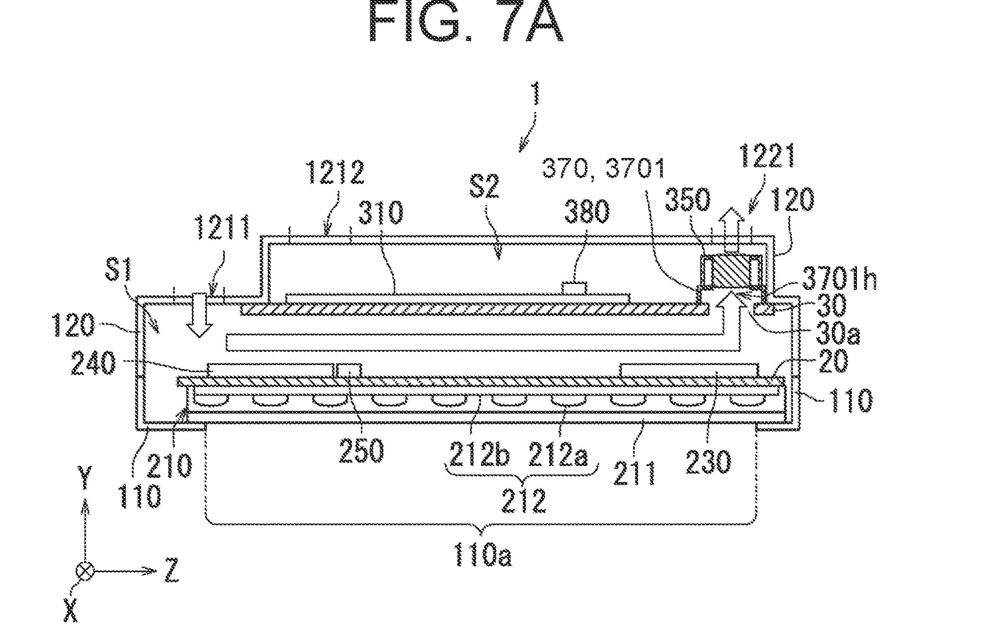
FIG. 7A is a diagram illustrating a path of an airflow generated by driving of a first fan.
Figure 7B:
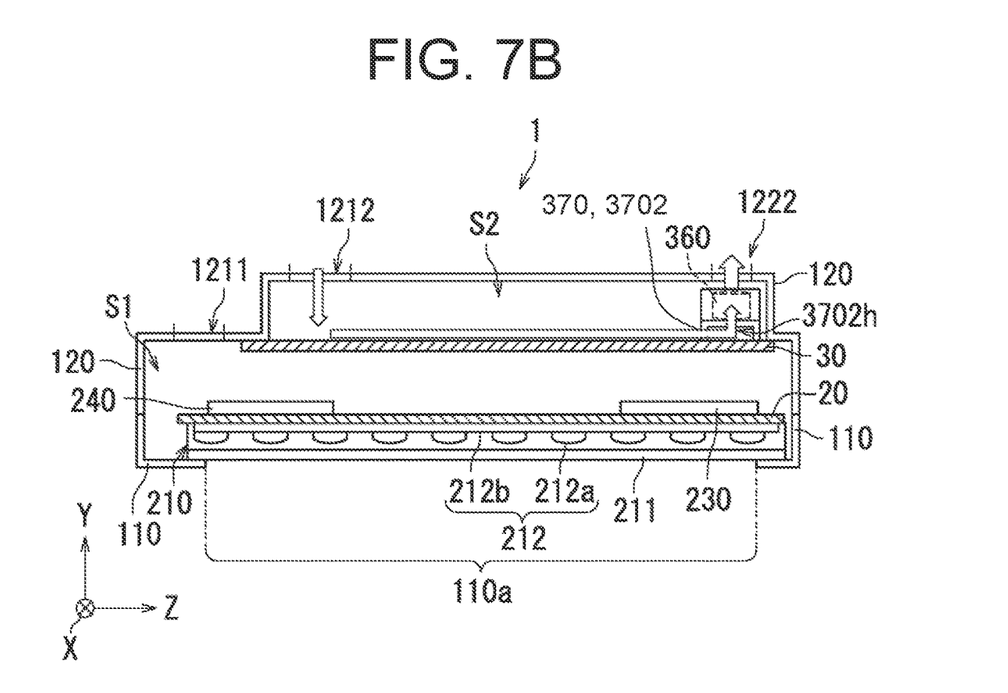
FIG. 7B is a diagram illustrating a path of an airflow generated by driving of a second fan.

FIG. 7A is a diagram illustrating a path of the airflow generated by driving of the first fan 350, and FIG. 7B is a diagram illustrating a path of the airflow generated by driving of the second fan 360. The airflow that passes the path illustrated by the arrow in FIG. 7A and is generated by the first fan 350 passes from the intake port 1211 through the first internal space S1, passes through the hollow region 3701h of the first installation part 3701 from the opening 30a of the second chassis 30 to flow into the first fan 350, and goes from the exhaust port 1221 to the outside. In addition, the airflow that passes the path illustrated by the arrow in FIG. 7B and is generated by the second fan 360 passes from the intake port 1212 through the second internal space S2, passes through the inside 3702h of the second installation part 3702 to flow into the second fans 360, and goes from the exhaust port 1222 to the outside. Thus, by the driving of the first fans 350 and the second fans 360, the air in the first internal space S1 and the air in the second internal space S2 do not mix with each other, and the air in each internal space is individually exhausted to the outside. That is, cooling of the display control circuit board 230, the LED driving circuit board 240 and the LEDs 212a disposed on the first chassis 20, and cooling of the main board 310 disposed on the second chassis 30 are individually performed.

Figure 8:
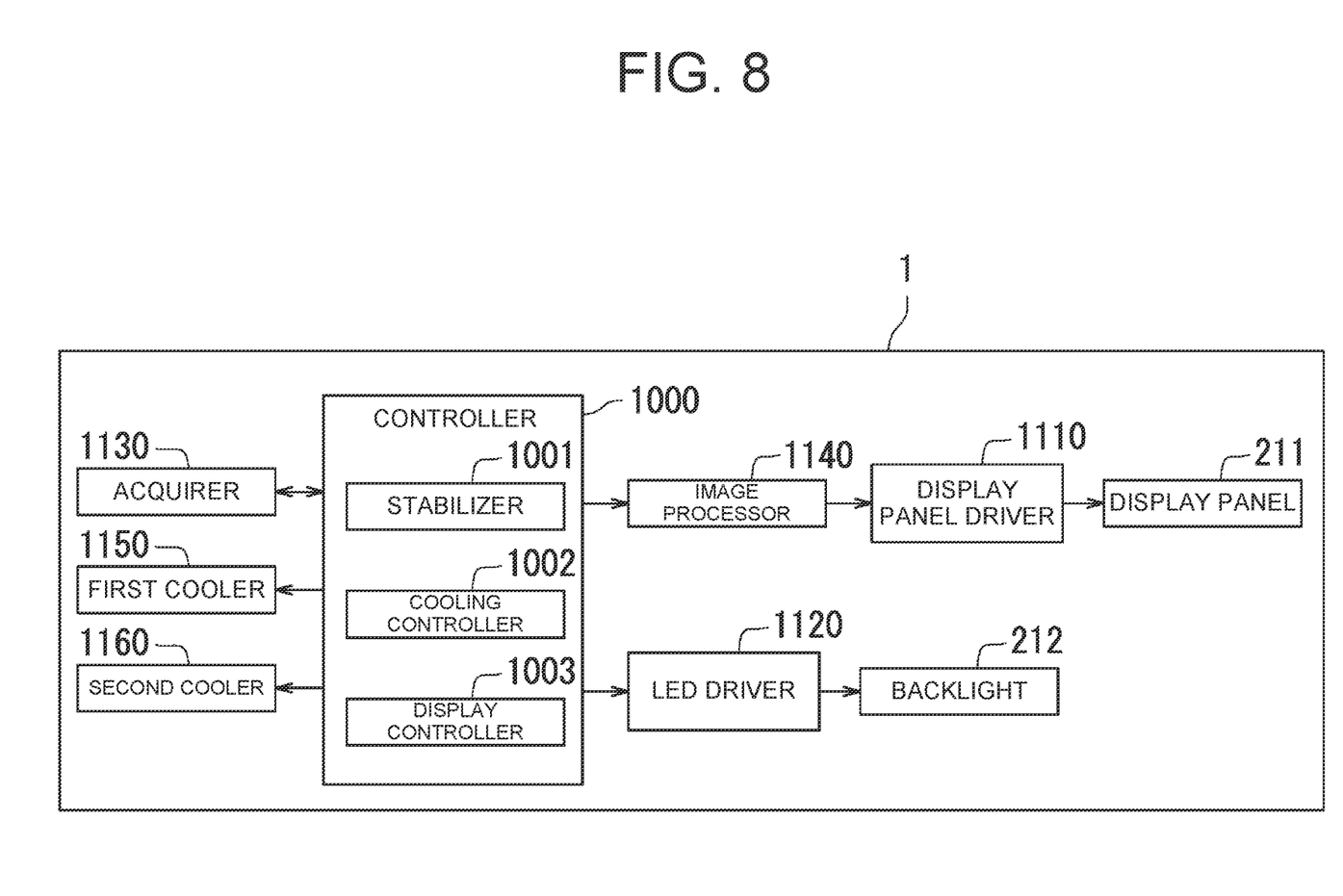
FIG. 8 is a functional block diagram of the display device in the embodiment.

Now, a function of the display device 1 in this embodiment will be described with reference to FIG. 8. FIG. 8 is a functional block diagram of the display device 1.

As illustrated in FIG. 8, the display device 1 includes a controller 1000, a display panel driver 1110, an LED driver 1120, an acquirer 1130, an image processor 1140, a first cooler 1150, a second cooler 1160, the display panel 211, and the backlight 212.

The display panel driver 1110 includes the display control circuit board 230 (see FIG. 2). The display panel driver 1110 displays an image on the display panel 211 by the display control circuit board 230, on the basis of an image signal from the image processor 1140.

The LED driver 1120 includes the LED driving circuit board 240 (see FIG. 2). The LED driver 1120 controls lighting of the backlight 212 by the LED driving circuit board 240 under control of the controller 1000.

The acquirer 1130 includes the first temperature detection circuit 250 and the second temperature detection circuit 380 (see FIG. 2). Under control of the controller 1000, the acquirer 1130 acquires the first temperature of the vicinity of the LED driving circuit board 240 by the first temperature detection circuit 250, and outputs the acquired result to the controller 1000. In addition, under control of the controller 1000, the acquirer 1130 acquires the second temperature of the second internal space S2 by the second temperature detection circuit 380 and outputs the acquired result to the controller 1000. That is, the first temperature is the temperature of the vicinity of the LED driving circuit board 240 having a strong correlation with the temperature of the LEDs 212a, and it can be presumed that the first temperature is the temperature of the LEDs 212a. The second temperature is the temperature of the second internal space S2 different from the first internal space S1 where the LEDs 212a are provided, and is equivalent to the temperature of the environment in which the LEDs 212a are provided.

The image processor 1140 includes the image processing circuit board 320 (see FIG. 2). An image correction process of adjusting the color and the luminance of an image is performed for an image signal output from the controller 1000, and an image signal obtained after the image correction process is output to the display panel driver 1110.

The first cooler 1150 includes the first fans 350 (see FIG. 2). The first cooler 1150 exhausts the air in the first internal space S1 to the outside by the first fans 350, under control of the controller 1000.

The second cooler 1160 includes the second fans 360 (see FIG. 2). The second cooler 1160 exhausts the air in the second internal space S2 to the outside by the second fans 360, under control of the controller 1000.

The controller 1000 includes a control circuit (not illustrated) including a CPU, a memory (a ROM and a RAM) in the main board 310 (see FIG. 2). The CPU executes a control program stored in the ROM, so that the controller 1000 functions as a stabilizer 1001, a cooling controller 1002, and a display controller 1003.

The stabilizer 1001 has a first adjustment mode and a second adjustment mode as an adjustment mode for performing a stabilization process of the luminance of the LEDs 212a. The stabilizer 1001 controls the acquirer 1130, and switches the adjustment mode in accordance with a temperature difference between the first temperature and the second temperature output from the acquirer 1130. That is, the stabilizer 1001 switches the adjustment mode in accordance with a difference between the temperature (first temperature) of the LED driving circuit board 240 having the correlation with the temperature of the LEDs 212a, and the temperature (second temperature) close to the temperature of the environment in which the LEDs 212a are provided.

The first adjustment mode is a mode for lighting the LEDs 212a of the backlight 212 so as to maximum the luminance of the backlight 212. The second adjustment mode is a mode for lighting the LEDs 212a such that the luminance of the LEDs 212a becomes predetermined target luminance. The predetermined target luminance is, for example, luminance suitable for an image which is an object to be displayed.

The stabilizer 1001 has a timer function, and measures a stabilization processing time. The stabilizer 1001 performs a stabilization process in at least one of the first adjustment mode and the second adjustment mode until the stabilization processing time exceeds a predetermined time. The stabilization process may be performed, for example, at the timing when a power supply (not illustrated) of the display device 1 is turned on, or may be performed at the timing of user operation. In a case where the stabilization process is performed by the user operation, for example, an operation button for instructing the display device 1 to perform the stabilization process may be provided, and the stabilization process may be started when the operation button is pressed.

The cooling controller 1002 controls driving of the first cooler 1150 and the second cooler 1160 in accordance with the adjustment mode. Specifically, in a case of the first adjustment mode, the cooling controller 1002 stops the first fans 350, and drives only the second fans 360. In a case of the second adjustment mode, the cooling controller 1002 drives the first fans 350 and the second fans 360.

The display controller 1003 generates an image signal of an image to be displayed, and outputs the image signal to the image processor 1140.

Operation

Figure 9:
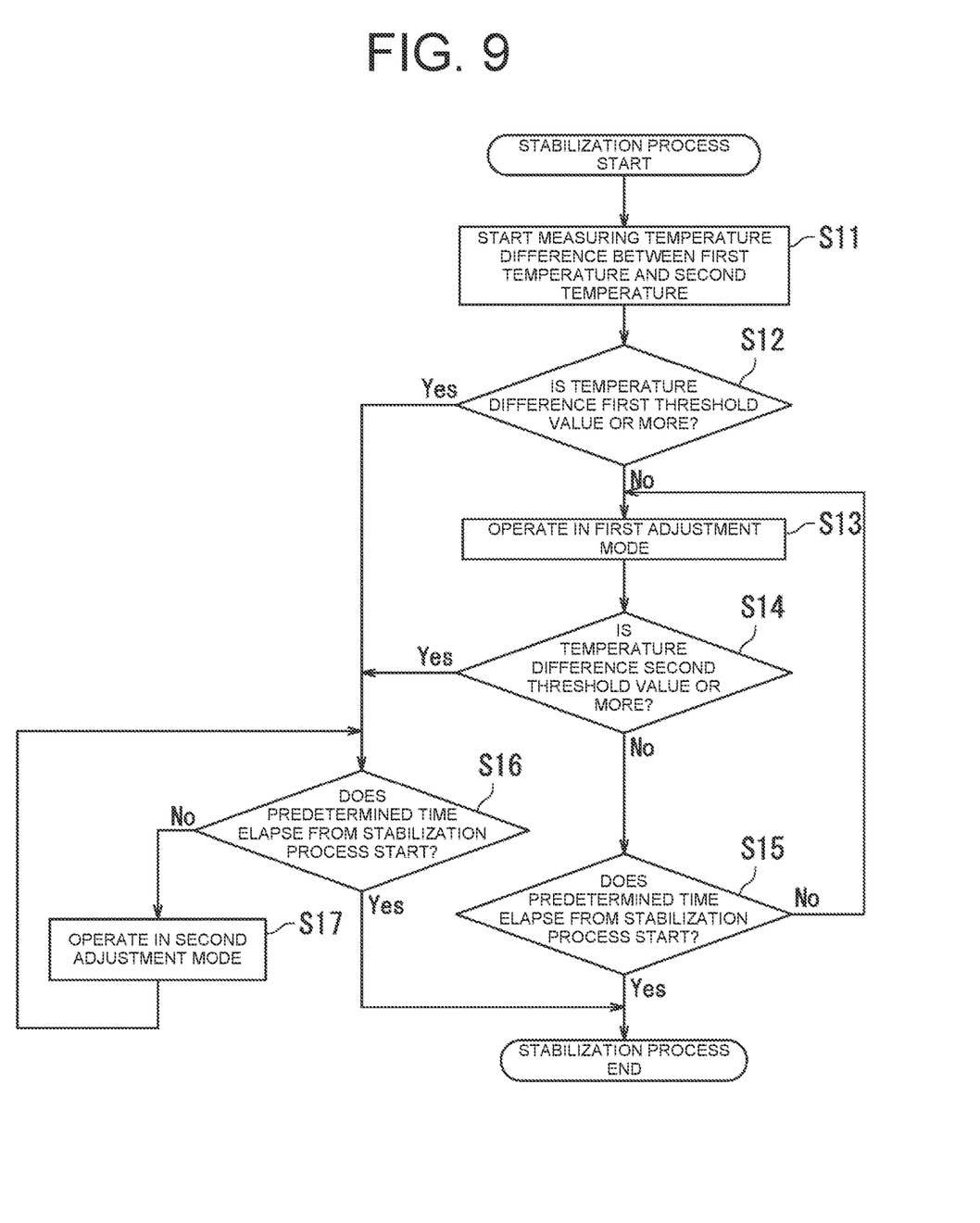
FIG. 9 is an operation flow of a stabilization process in the embodiment.

Now, operation of the stabilization process in the display device 1 will be described with reference to FIG. 9. FIG. 9 is an operation flow of the stabilization process in this embodiment.

In Step S11, the display device 1 starts acquisition of the first temperature and the second temperature by the acquirer 1130, and starts measuring a temperature difference between the acquired first temperature and second temperature. Specifically, the stabilizer 1001 drives the first temperature detection circuit 250 and the second temperature detection circuit 380, and detects the first temperature (T1) of the vicinity of the LED driving circuit board 240 and the second temperature (T2) of the vicinity of the main board 310 at regular intervals. Then, the stabilizer 1001 starts measuring a temperature difference ΔT(=T1−T2) of the first temperature (T1) and the second temperature (T2) detected at the regular intervals.

In a case where the measured temperature difference ΔT is a first threshold value or more (for example, 14° C. or more) (Step S12: No), the display device 1 sets the adjustment mode to the first adjustment mode by the controller 1000 (Step S13).

Specifically, the stabilizer 1001 outputs a lighting control signal indicating the maximum luminance of the LEDs 212a to the LED driver 1120 by the setting of the first adjustment mode. In this case, for example, a PWM signal having a duty ratio of 100% is input as a PWM signal based on the lighting control signal from the LED drive circuit (not illustrated) in the LED driving circuit board 240 to the LEDs 212a. The cooling controller 1002 stops the first fans 350, and drives only the second fans 360. Consequently, the air in the second internal space S2 provided with the main board 310 is exhausted to the outside. That is, due to the first adjustment mode, the first internal space S1 where the LED driving circuit board 240 is provided is not cooled, and the LEDs 212a is lighted with maximum luminance.

When the temperature difference ΔT between the first temperature and the second temperature is less than the second threshold value (for example, 40° C.) (Step S14: No) in Step S14, and a predetermined time (for example, ten minutes) does not elapse from the start of the stabilization process (Step S15: No), the display device 1 continues processes in Steps S13 and S14. That is, after the first adjustment mode starts, the first adjustment mode is continued until the temperature difference ΔT between the first temperature and the second temperature reaches the second threshold value or more within the predetermined time.

When the temperature difference ΔT between the first temperature and the second temperature is the second threshold value or more (for example, 40° C. or more) in Step S14, and the predetermined time (for example, ten minutes) does not elapse from the start of the stabilization process (Step S14: Yes, Step S6: No), the display device 1 switches the adjustment mode from the first adjustment mode to the second adjustment mode by the controller 1000 (Step S17).

Specifically, by the switching to the second adjustment mode, the stabilizer 1001 outputs a lighting control signal indicating target luminance to the LED driver 1120. In this case, for example, a PWM signal having a duty ratio of about 80% is input as a PWM signal based on the lighting control signal from the LED drive circuit (not illustrated) in the LED driving circuit board 240 to the LEDs 212a. Then, the cooling controller 1002 drives the first fans 350 and the second fans 360. Consequently, not only the air in the second internal space S2 but also the air in the first internal space S1 where the LED driving circuit board 240 is provided is exhausted to the outside. That is, by the switching to the second adjustment mode, the first internal space S1 and the second internal space S2 are cooled, and the LEDs 212a is lighted with the target luminance.

In a case where the temperature difference ΔT is 40° C. or more, the temperature of the LED driving circuit board 240 sufficiently rises, the LEDs 212a themselves are sufficiently warmed, and the luminance of the LEDs 212a is in an stabilized state. In this state, when the adjustment mode is switched from the first adjustment mode to the second adjustment mode, the first internal space S1 is cooled, and the LED driving circuit board 240 and the LEDs 212a are cooled. As a result, the luminance of the LEDs 212a is converged to the target luminance.

The display device 1 continues the stabilization process in the first adjustment mode or the second adjustment mode by the controller 1000 until the predetermined time elapses from the start of the stabilization process (Step S15: No, Step S16: No). Then, the display device 1 terminates the stabilization process by the controller 1000 when the predetermined time elapses from the start of the stabilization process (Step S15: Yes, Step S16: Yes).

Figure 10:
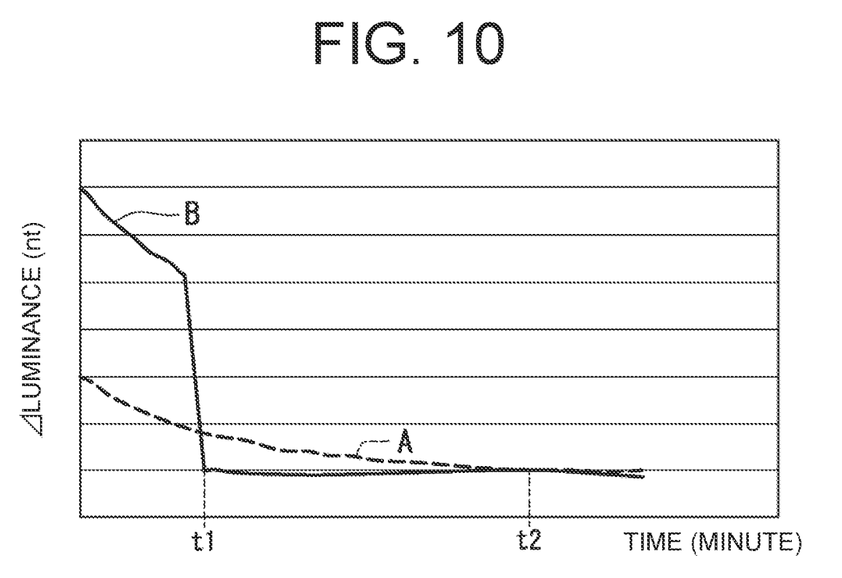
FIG. 10 is a graph illustrating luminance change of LEDs in a case where the stabilization process is performed in each of a first adjustment mode and a second adjustment mode.

FIG. 10 is a graph illustrating luminance change of the LEDs 212a in a case where the stabilization process is performed in each of the first adjustment mode and the second adjustment mode. In FIG. 10, a curve (A) illustrated by a broken line indicates the luminance change of the LEDs 212a in a case where the stabilization process is performed in the second adjustment mode, and a curve (B) illustrated by a solid line indicates the luminance change of the LEDs 212a in a case where the stabilization process is performed in the first adjustment mode.

As illustrated by the curve (A) and the curve (B), in either adjustment mode, the luminance or the LEDs 212a is lowered with the lapse of time, and thereafter the luminance is stabilized. While the time period when the luminance is stabilized is t2 (minutes) in the curve (A), the time period when the luminance is stabilized is t1 (t1<t2) (minutes) in the curve (B). That is, the time period when the luminance is stabilized, illustrated by the curve (B), is shorter. In the first adjustment mode, the LEDs 212a is lighted with the maximum luminance, and therefore the temperatures of the LED driving circuit board 240 and the LEDs 212a rise more quickly, compared to the case of the second adjustment mode in which the LEDs 212a are lighted with the target luminance lower than the maximum luminance. Furthermore, in the first adjustment mode, the first internal space S1 including the LED driving circuit board 240 is not cooled, and therefore the temperatures of the LED driving circuit board 240 and the LEDs 212a can be increased at a higher speed, compared to the case of the second adjustment mode in which the first internal space S1 and the second internal space S2 are cooled. As a result, the luminance of the LEDs 212a can be stabilized at a higher speed, and the stabilization process of the luminance of the LEDs 212a can be terminated in a short time.

The display device 1 in this embodiment performs the luminance stabilization process in consideration of the environment temperature which affects the luminance of the LEDs 212a. Therefore, the stabilization process can be more reliably terminated in a short time, compared to a case where the stabilization process is performed on the basis of only the temperature of the LEDs 212a.

As described above, the embodiment according to the present disclosure is described. The present disclosure is not limited to the above embodiment, and can be carried out in various embodiments without deviating from the gist. In order to facilitate understanding, each component is schematically mainly illustrated in the drawings, and the thickness, the length, the number, and the like of each component illustrated in the drawings are different from the actual one due to the convenience of the drawings. In addition, the shape, the dimensions, and the like of each component illustrated in the above embodiment are merely examples, and are not particularly limited, and various changes can be made within a range that does not substantially deviate from the effect of present disclosure.

(1) The second temperature may be the temperature of the outside of the display device 1, that is, the installation environment temperature of a place where the display device 1 is installed. In this case, in the display device 1, an acquirer that sequentially acquires the installation environment temperature by wired or wireless connection is provided. Then, the stabilizer 1001 may measure the temperature difference between the first temperature and the second temperature by using the installation environment temperature acquired by the acquirer as the second temperature.

(2) The second temperature detection circuit 380 may be provided in the vicinity of the intake ports 1211 and 1212 of the first back surface 1201 and the second back surface 1202 in the second internal space S2. The intake ports 1211, and 1212 communicate with the outside of the housing 10, and therefore the difference of the temperature of the vicinity of the intake ports 1211 and 1212 and the temperature of the outside is small. Therefore, the temperature closer to the temperature of the environment in which the display device 1 is installed can be detected as the second temperature. That is, the second region R2 only needs to be a region other than the first region R1 in the housing 10, and more preferably only needs to be a region where the temperature closer to the temperature of the outside can be measured.

(3) The first region R1 is not limited to the region in the vicinity of the LED driving circuit board 240. The first region R1 may be a region separated from the LED driving circuit board 240 in the region including the LEDs 212a. In this case, the first acquirer may measure the temperature at the position separated from the LED driving circuit board 240, and presume the temperature (first temperature) of the LEDs 212a from the measured temperature by using a predetermined calculation formula.

(4) In the stabilization process, in the first adjustment mode, only lighting control of the LEDs 212a by at least the stabilizer 1001 may be performed. That is, driving control of the first fans 350 and the second fans 360 by the cooling controller 1002 in the first adjustment mode is not required.

(5) The display device 1 has the two internal spaces (the first internal space S1 and the second internal space S2) shielded from each other in the housing 10, but may have only one internal space in the housing 10.

(6) As a condition that the first adjustment mode is set in Step S12: No in FIG. 9, a condition that the different between the acquired first temperature and the predetermined target temperature of the LEDs 212a is less than the predetermined threshold value may be added. That is, in a case where the measured temperature difference ΔT is less than the first threshold value (for example, 14° C.) (Step S12: No), the difference between the first temperature and the above target temperature is less that the predetermined threshold value, the controller 1000 may set the first adjustment mode as the adjustment mode. In a case where the stabilization process is performed after the LEDs 212a are lighted, the LEDs 212a are sometimes warm to some extent. Therefore, in a case where the temperature difference ΔT is the first threshold value or more, and the difference between the first temperature and the target temperature is a certain level or more, the adjustment mode may be the first adjustment mode, and other than that may be the second adjustment mode.

The invention claimed is:

1. A display device comprising:
a housing;
a display panel provided in the housing;
a light source provided in the housing, and including an LED (Light Emitting Diode) that irradiates the display panel with light;
a first acquirer that acquires a first temperature in a first region including a region where the light source is disposed in the housing;
a second acquirer that acquires a second temperature in a second region different from the first region; and
a stabilizer that has a first adjustment mode for lighting the LED with maximum luminance as an adjustment mode for stabilizing luminance of the LED, and that operates the LED in the first adjustment mode in a case where a temperature difference between the first temperature and the second temperature is a first threshold value or more.

2. The display device according to claim 1, wherein
the stabilizer further has a second adjustment mode for operating the LED such that luminance of the LED becomes target luminance lower than the maximum luminance, as the adjustment mode, and
the stabilizer operates the LED in the first adjustment mode, and switches from the first adjustment mode to the second adjustment mode in one of a case where the temperature difference is not less than a second threshold value larger than the first threshold value, and a case where an operating time in the first adjustment mode is less than a predetermined time.

3. The display device according to claim 2, wherein
the second region is a region other than the first region in the housing.

4. The display device according to claim 3, wherein
the housing has a front surface that exposes a display region of the display panel, and a back surface on a side opposite to the front surface, and
in the housing,
a first chassis, a second chassis facing the first chassis and disposed on a side of the back surface with respect to the first chassis, a first internal space layer that is an internal space between the first chassis and the second chassis and includes the first region, and a second internal space layer that is an internal space between the second chassis and the back surface of the housing and includes the second region are further included, and
the first internal space layer and the second internal space layer are shielded from each other.

5. The display device according to claim 4, further comprising:
a first exhauster that includes a first fan, and exhausts air in the first internal space layer to outside the housing by driving the first fan;
a second exhauster that includes a second fan, and exhausts air in the second internal space layer to outside the housing by driving the second fan, wherein
the first exhauster stops driving of the first fan in the first adjustment mode, and drives the first fan in the second adjustment mode, and
the second exhauster drives the second fan in the first adjustment mode and the second adjustment mode.

6. The display device according to claim 5, wherein
the first exhauster further includes an exhaust duct that penetrates the second chassis and that is shielded from the second internal space layer, and a first exhaust port provided in the back surface of the housing, and exhausts air in the first internal space layer from the exhaust duct to outside through the first exhaust port, and
the second exhauster further includes a second exhauster provided in the back surface of the housing, and exhausts air in the second internal space layer from the second exhauster to the outside.

7. The display device according to claim 1, wherein
the second region is outside the housing.

* * * * *